(12) United States Patent
Fishman et al.

(10) Patent No.: US 7,649,374 B2
(45) Date of Patent: Jan. 19, 2010

(54) TEMPERATURE CONTROL IN AN INTEGRATED CIRCUIT

(75) Inventors: Alexander Fishman, Sunnyvale, CA (US); Denis Y. Lefebvre, Salinas, CA (US); Serguei Dorofeev, Sunnyvale, CA (US); Dmitri Bannikov, Mountain View, CA (US); Chonghua Zhou, Diamond Bar, CA (US); Robert L. Fennelly, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 657 days.

(21) Appl. No.: 11/469,716

(22) Filed: Sep. 1, 2006

(65) Prior Publication Data
US 2007/0080702 A1 Apr. 12, 2007

Related U.S. Application Data

(60) Provisional application No. 60/717,500, filed on Sep. 15, 2005.

(51) Int. Cl.
*G01R 31/26* (2006.01)

(52) U.S. Cl. ............... 324/765; 324/760; 324/158.1
(58) Field of Classification Search ............ None
See application file for complete search history.

(56) References Cited

U.S. PATENT DOCUMENTS

| 5,396,059 | A  | * | 3/1995 | Yeates ............ 250/214 C |
| 6,937,949 | B1 |   | 8/2005 | Fishman et al. |
| 7,301,325 | B2 | * | 11/2007 | Waschura et al. ...... 324/158.1 |
| 2004/0225951 | A1 | * | 11/2004 | Rose et al. ............ 714/819 |

* cited by examiner

*Primary Examiner*—Vinh P Nguyen
(74) *Attorney, Agent, or Firm*—Workman Nydegger

(57) ABSTRACT

One example of a test board includes first and second communication ports configured for communication with a master device and a DUT, respectively. A bit error rate tester of the test board is arranged for communication with the master device and with the DUT by way of the first and second communication ports, respectively, and the bit error rate tester includes at least one IC whose maximum data rate is temperature sensitive. Finally, the test board includes a temperature control system arranged to control the IC temperature so that a maximum data rate of the IC can be adjusted through the use of thermal effects.

15 Claims, 13 Drawing Sheets

TEMPERATURE CONTROL IN AN INTEGRATED CIRCUIT

RELATED APPLICATIONS

This application claims the benefit of U.S. Provisional Patent application Ser. No. 60/717,500, entitled TEMPERATURE CONTROL IN AN INTEGRATED CIRCUIT, filed 15 Sep. 2005, and incorporated herein in its entirety by this reference.

BACKGROUND OF THE INVENTION

1. The Field of the Invention

The present invention relates generally to systems, methods, and devices for high speed data transmission. More particularly, embodiments of the present invention concern systems, methods, and devices for increasing the data transmission rate of electronic devices.

2. Related Technology

Computer and data communications networks proliferate in a variety of technological, business, and other environments due to an increase in the performance of computer and network equipment and an increased demand for communication bandwidth. Communications networks, such as wide area networks ("WANs"), local area networks ("LANs"), metropolitan area networks ("MANs"), and storage area networks ("SANs") allow increased productivity and utilization of distributed computers or stations through the sharing of resources and the efficient transfer of data and other information.

As the demand for and use of computer and data communications networks increases, the demand for improved network capabilities also increases. For example, communications networks with increased data transmission rates are in high demand. Technological, commercial, and industrial enterprises place a premium on the ability to transmit and receive information across communications networks at the highest possible rates. Therefore, developments in communications network technology, including developments in electrical devices used in a communications network, are extremely valuable.

In order to provide devices with increased performance capabilities, methods for improving the performance of network devices are continually evolving and improving. One way in which the performance of electrical devices used in communications networks can be improved is by cooling the devices. Manufacturers of electrical devices cool the electrical devices so that the temperature of the device falls within a temperature range known to correspond to relative improvements in the performance of the device. Such cooling may increase the data transmission rate for electrical devices used in communications networks, and thereby contribute to enhancement of the performance of such networks.

The method of increasing the data transmission rate of electrical devices by cooling the temperature of the devices to a temperature within a certain range has proven effective and has therefore gained wide acceptance. Correspondingly, industrial standards and ranges for temperatures to be used in networks concerned with high data transmission rates have been developed. For example, one industrial range of temperatures corresponding to high data transmission rates in integrated circuits is approximately −40° C. to +85° C., while a commercial range is approximately 0° C. to 70° C. By ensuring that the temperature of electrical devices remain within an appropriate recommended range, the data transmission rate of the device can be enhanced.

However, while cooling electrical devices to temperatures within a recommended range enhance the performance of the electrical device, there remains an interest in achieving yet further increases in data transmission rates of electrical and optoelectronic devices.

BRIEF SUMMARY OF AN EXAMPLE EMBODIMENT OF THE INVENTION

The foregoing, and other, problems relating to the testing of network and other devices are addressed by embodiments of the present invention which are concerned with systems and methods for increasing device data rates. By regulating the temperature of a device and maintaining that temperature at a level corresponding to a desired performance point, the data rate of the device is increased.

In one example embodiment, the temperature of a serializer/deserializer ("SERDES"), such as may be employed in optoelectronic test equipment for example, is regulated by way of a temperature control system configured and arranged to manage heat transfer rates associated with the SERDES. One example temperature control system includes thermoelectric coolers ("TECs"), heat sinks, and blowers. Among other things, this example temperature control system maintains the temperature of the SERDES at a target temperature that corresponds with a desired data rate.

The foregoing, and other, aspects of the present invention will become more fully apparent from the following description and appended claims.

BRIEF DESCRIPTION OF THE DRAWINGS

To further clarify the above and other aspects of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The drawings are not drawn to scale. The invention will be described and explained with additional specificity and detail through the use of the accompanying drawings in which.

DETAILED DESCRIPTION OF EXEMPLARY EMBODIMENTS OF THE INVENTION

Embodiments of the present invention concern systems and methods for improving the performance characteristics of devices that transmit and receive digital data. By substantially maintaining the temperature of a device at a target level, so that a corresponding data rate is achieved, embodiments of the present invention provide a mechanism for enhancing data rates used in testing evolutions, systems and devices.

In one embodiment of the invention, a test board is provided that is configured to implement, among other things, thermally-based control of maximum data rates associated with a testing evolution. In general, the test board is connected to a master device, such as a master transceiver, and to a device under test ("DUT"). In one example, the DUT comprises a transceiver, but the scope of the invention is not limited to use with transceivers. The master device and DUT are also connected with each other by data transmission lines, such as optical fibers for example. One exemplary test board includes a temperature control system, and a bit error rate tester ("BERT") that includes a pair of serializer/deserializers ("SERDES") arranged for communication with one or both of the DUT and master device. One or both of the master device and the DUT may be implemented as optoelectronic transceivers.

In operation, a maximum test data rate associated with the test board is achieved by manipulating the temperature control system to control the temperature of the SERDES. More particularly, a desired maximum test data rate can be achieved through management of the SERDES temperature. In this way, test data rates can be desirably elevated beyond what would otherwise be achievable. This notion may also be expressed herein in terms of a device having a temperature sensitive maximum data rate.

As the foregoing makes clear, temperature control systems and components such as those disclosed herein are examples of structural implementations of a means for regulating temperature. Of course, any other systems or devices of comparable functionality may alternatively be employed and the scope of the invention is not limited to the aforementioned exemplary structural implementations.

I. Exemplary Test Boards

Figure 1:
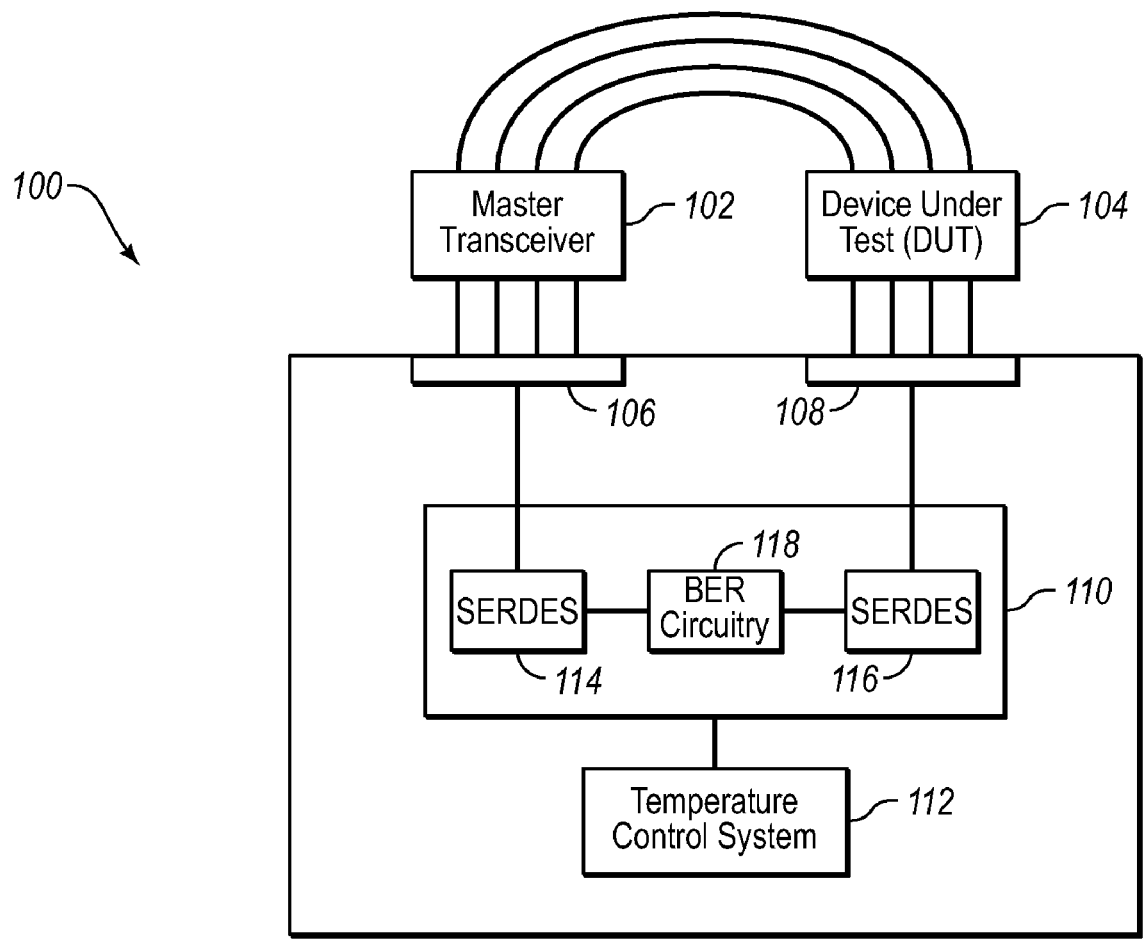
FIG. 1 is a block diagram of an exemplary test board configured to connect to a master transceiver and device under test, where the exemplary test board includes a bit error rate tester and temperature control system.

With attention now to FIG. 1, details are provided concerning an exemplary test board 100 for testing the performance of network devices. In general, the test board can be used for testing a wide variety of systems, devices and components. Some embodiments of the test board 100 are particularly well suited for evaluating the performance of devices such as optoelectronic transceivers, but the scope of the invention is not limited to such exemplary applications.

In addition, embodiments of the invention are suitable for implementation in connection with a variety of different data transmission protocols and line rates. Thus, one exemplary embodiment of the invention is directed to a test board that includes, among other things, a 1×2×4 BERT configured to perform testing procedures on a DUT at several different Fibre Channel rates, including the ×1 Fibre Channel rate of 1.0625 Gb/s, the ×2 Fibre Channel rate of 2.125 Gb/s, and the ×4 Fibre Channel rate of 4.25 Gb/s. Of course, various other protocols and line rates may be supported by other embodiments as well. Thus, other exemplary test boards include a BERT that is compatible with Gigabit Ethernet protocol and configured to perform testing procedures on a DUT at Gigabit Ethernet rates of 1.25 Gb/s and 2.5 Gb/s.

With continuing attention now to FIG. 1, the exemplary test board 100 is configured to be connected with a master device, such as master transceiver 102, and to a DUT 104. Connection of the test board 100 to the master transceiver 102 is implemented by way of port 106, while connection of the test board 100 to the DUT 104 is implemented by way of port 108. The ports 106 and 108 may comprise optical or electrical connections.

In general, the DUT 104 to which the test board 100 is connected may comprise, for example, any device capable of sending and/or receiving data signals. For example, in one embodiment of the invention, the DUT 104 comprises an optoelectronic transceiver. However, the scope of the invention is not limited to systems, methods and devices for use in connection with optoelectronic components but, more generally, embodiments of the invention can be employed with a variety of other electrical, optical and optoelectronic components as well.

As indicated in FIG. 1, the illustrated test board 100 includes a Bit Error Rate Tester ("BERT") 110 that is connected to the master transceiver 102 and the DUT 104 by way of ports 106 and 108, respectively. The data rate at which the BERT 110 operates is controlled, at least in part, by way of a temperature control system 112. In general, the temperature control system 112 cools the BERT 110 so as to increase the maximum rate at which data can be sent and received through the BERT 110. Exemplary embodiments of the temperature control system 112 are implemented in a closed-loop configuration in which temperature data relating to the BERT 110 is gathered and used to control operation of the temperature control system 112. In other cases however, an open-loop temperature control system may be employed. Some embodiments of such an open-loop system are similar to the closed-loop systems disclosed herein, except that such open-loop systems may not provide temperature or data rate feedback to the temperature control system.

In some embodiments, the operation of the temperature control system 112 is directed particularly to controlling the temperature of a pair of SERDES 114 and 116 of the BERT 110. As indicated in FIG. 1, the BERT 110 additionally includes various other BER circuitry 118 configured to implement bit error rate ("BER") testing functionality. It should be noted that embodiments of the invention are not constrained to BER testing, but can be employed in various other types of testing as well. More generally, embodiments of the invention are suitable for use in any testing evolution where it would be desirable to maximize the test data rate.

In general, the operation of the test board 100 proceeds as follows. Initially, the test board 100 is connected to master transceiver 102 and DUT 104 through ports 106 and 108, respectively, so that a bit error rate of the DUT 104 can be determined. With reference to FIG. 1, the master transceiver 102 having a known bit error rate, which may be zero or nearly zero, and DUT 104, are connected in parallel to the test board 100, and are connected to each other in an immediate loop-back configuration. In some example alternative arrangements, the loop-back could be replaced by a loop-back with attenuator, or with a loop-back using 80/100/120 Km fiber.

Once the test board 100 has been connected with the DUT 104 and master transceiver 102, the BER of the DUT 104 can be determined. More particularly, the BER circuitry 118, which in some embodiments is integrated within each SERDES 114 and 116, generates a test pattern, such as a pseudorandom bit sequence ("PRBS") for example, that can be used to check the response of the DUT 104. It should be noted that various other types of test patterns or sequences can also be employed. Such test patterns can be generated by the BERT 110, or can be user-defined. After the test pattern is generated, the BER circuitry 118 transmits the test pattern to SERDES 114 where the data is deserialized.

The deserialized test pattern is then transmitted to the master transceiver 102 by way of port 106. The master transceiver 102 transmits the test pattern to DUT 104, which further transmits the test pattern to SERDES 116 where the test pattern is deserialized. Because the master transceiver 102 in this embodiment does not add any errors, the test pattern transmitted from the master transceiver 102 to the DUT 104 provides a baseline for analysis of the performance of the DUT 104, as discussed in further detail below.

After the test pattern has been transmitted through the DUT 104, the test pattern passes on to the SERDES 116 which serializes the test pattern and forwards the test pattern to BER circuitry 118. It should be noted here that while, in this exemplary process, the test pattern generated by BER circuitry 118 was initially sent to master transceiver 102 through SERDES 114, the flow of the test pattern can be reversed. Thus, in other exemplary processes, the test pattern generated by BER circuitry 118 is initially sent to the DUT 104 through SERDES 116, and then to BER circuitry 118 through master transceiver 102 and SERDES 114.

With continuing attention now to the operation of the test board 100, the test pattern is received from the SERDES 116 at the BER circuitry 118. The BER circuitry 118 then compares the received test pattern with the test pattern initially generated by BER circuitry 118. In this way, the BER circuitry 118 is able to determine the BER of the received test pattern that can be attributed to the DUT 104.

In connection with the operation of the BERT 110, the temperature control system 112 regulates the temperature of BERT 110. As contemplated herein, regulation of the BERT temperature is a broad notion that embraces raising the temperature of the BERT, lowering the temperature of the BERT, maintaining the temperature of the BERT, and combinations of the aforementioned processes.

In exemplary embodiments, the temperature control system 112 cools the BERT 110 to a temperature that corresponds with a desired maximum data rate that otherwise could not be achieved by the BERT 110 without such cooling effect. With respect to the particular embodiment of the test board 100 illustrated in FIG. 1, the temperature control system 112 regulates the temperature of SERDES 114 and 116 during testing evolutions so that the data rate associated with the testing evolution can be maintained at desired level. As contemplated herein, such temperature regulation can include heating and/or cooling of an IC, or group of ICs, and/or other devices.

The particular cooling effect, and consequent data rates, that are achieved can vary widely depending upon variables such as, but not limited to, the equipment and systems employed in the testing, the DUT, the temperature control system, and the ambient temperatures. Accordingly, the scope of the invention should not be construed to be limited to the achievement of the specific examples of cooling and data rate effects disclosed herein.

Inasmuch as embodiments of the invention permit devices to be readily tested at data rates significantly higher than the nominal data rates of those devices, an operator can easily and reliably predict the performance of a particular device under extreme conditions, prior to deployment of the device in a network or other system. Such functionality also permits the operator to identify the boundaries of a data rate envelope within which the device will operate acceptably.

As noted earlier herein, embodiments of the temperature control system 112 can be employed in connection with a variety of different systems and devices. Consistently, useful effects can be obtained with BERTs of various types and configurations. In one example, a temperature control system as exemplified in this disclosure has been employed with a BERT having a nominal rating of 3.125 Gb/s. By using a temperature control system to cool the SERDES of the BERT, the maximum data rate of the BERT can be increased and control of the BERT sensitivity improved.

In this particular example, the uncooled BERT was overclocked in a preliminary test and was able to deliver 3.6 Gb/s with acceptable jitter. However, by cooling the SERDES of the same BERT with an exemplary temperature control system, a data rate of 4.4 Gb/s, within acceptable jitter tolerances, was achieved for the BERT. This change in effective data rate from 3.6 Gb/s to 4.4 Gb/s represents about a 22% increase over the nominal data rate of the BERT. Of course, greater or smaller increases in data rates may be achieved in other circumstances, depending upon considerations such as the nature and configuration of the temperature control system and the cooled component(s), and environmental conditions.

In another particular example, data rates greater than 5 Gb/s were achieved in connection with a Texas Instruments SERDES that was nominally rated at 3.125 Gb/s, even though that particular SERDES was purported to be capable of data rates no greater than 3.7 Gb/s. In this case, the IC temperature was cooled to below about 12° C. to achieve these results.

Figure 2:
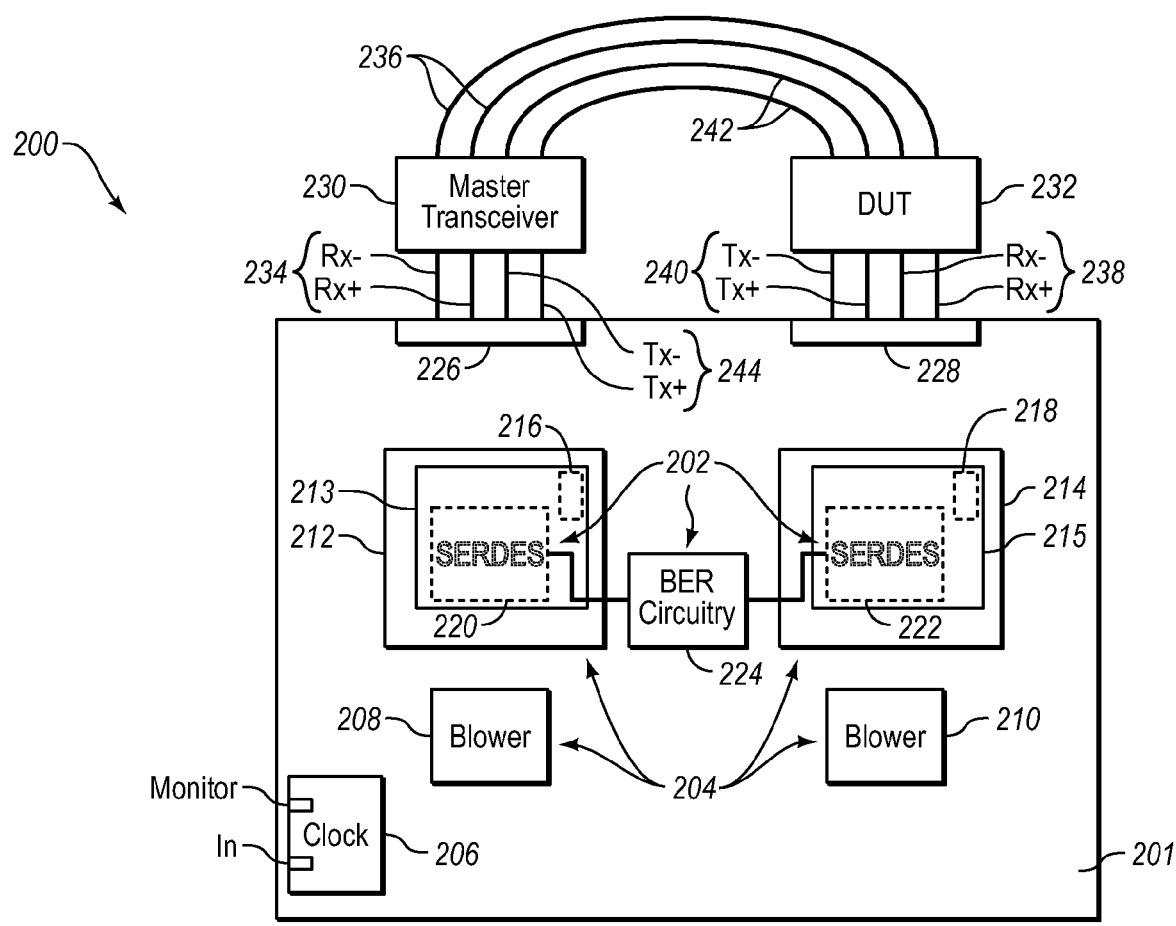
FIG. 2 is a block diagram illustrating an exemplary test board and providing details concerning the configuration of an exemplary temperature control system.

With attention now to FIG. 2, details are provided concerning an exemplary test board 200. It should be noted that while FIG. 2 illustrates an exemplary test board 200 including devices whose temperature is regulated in order to achieve desired effects with regard to an associated data rate, devices regulated in this way may, consistent with the scope of the invention, be used in any number of different operating environments. For example, and as discussed in further detail below, a BERT is an exemplary environment in which the temperature of devices, such as a SERDES, may be regulated according to embodiments of the present invention. However, any other operating environment in which it may be desirable to control the temperature of a device, such as an integrated circuit, so as to achieve a desired effect with regard to an associated data rate, is embraced within the scope of the invention.

In the embodiment illustrated in FIG. 2, the test board 200 comprises an insulated board that includes various circuits and components, such as, but not limited to, a BERT 202, temperature control system 204, as well as a clock 206 that generally serves to provided a 'heartbeat' or clock signal in connection with which data is transmitted. As discussed in further detail below in connection with FIGS. 3A through 3D, the BERT 202, temperature control system 204, and clock 206, are also connected to various power and control circuits of the test board 200, such as a controller and microcomputer for example (not shown).

In the illustrated exemplary embodiment, the temperature control system 204 includes blowers 208 and 210, thermoelectric coolers ("TEC") 212 and 214 and associated heat sinks 213 and 215, and temperature sensors 216 and 218. The BERT 202 in connection with which the temperature control system 204 is employed includes, among other things, a SERDES 220, SERDES 222, and BER circuitry 224. The SERDES 220 and 222 temperature is controlled by the temperature control system 204, as discussed in further detail below. In one exemplary implementation, the BER circuitry 224 includes a programmable pattern generator, an error detector, a bit error counter, and time interval counter and is configured to generate various types of test patterns and sequences such as, for example, a PRBS of about $2^7-1$ to $2^{31}-1$ bits in length. Of course, BER circuitry of other configurations and capabilities may alternatively be employed.

Note that the blower 208, TEC 212, temperature sensor 216, and SERDES 220 may also be referred to herein, respectively, as a master blower, master TEC, master temperature sensor, and master SERDES, denoting the association of those components with the master device in connection with which the test board 200 is employed. In like fashion, the blower 210, TEC 214, temperature sensor 218, and SERDES 222 may also be referred to herein, respectively, as a DUT blower, DUT TEC, DUT temperature sensor, and DUT SERDES, denoting the association of those components with the DUT in connection with which the test board 200 is employed.

With more particular attention now to the relation between the exemplary temperature control system 204 and the BERT 202, the temperature control system 204 includes, as noted above, a pair of blowers 208 and 210, such as fans or any other devices capable of generating a flow of air. Generally, the blowers 208 and 210 provide forced air cooling and operate in connection with TECs 212 and 214 to implement desired thermal effects with respect to the BERT 202. In some cases, a desired effect may be achieved solely with the blowers 208 and 210, or solely with the TECs 212 and 214 while, in other cases, the blowers 208 and 210, and the TECs 212 and 214, operate together to achieve a desired effect. Of course, additional or alternative cooling mechanisms and devices can alternatively be employed.

In general, each of the TECs 212 and 214 is arranged for thermal communication with one or more respective target components, such as a component of the BERT 202 for example, that is to be cooled, SERDES 220 and SERDES 222 in this exemplary case. Of course, multiple TECs can be used to operate in connection with a single target component while, in other cases, a single TEC can be operated in conjunction with multiple target components. Accordingly, the illustrated arrangement is exemplary only and is not intended to limit the scope of the invention in any way.

In the illustrated arrangement, each of the SERDES 220 and 222 and temperature sensors 216 and 218 are mounted on the PCB 201. Corresponding TECs 212 and 214 are mounted on the SERDES and temperature sensor 216 and 218 tops. Heat sinks 213 and 215 are positioned on the TEC 212 and 214 tops, respectively. Alternatively, the SERDES 220 and 222 can be arranged in any other fashion that will permit the TECs and/or other cooling devices to effect heat transfer processes with respect to the SERDES.

In the illustrated embodiment, the temperature control system 204 includes a pair of blowers 208 and 210 which blow air into contact with the heat sinks 213 and 215 and operate in conjunction with TECs 212 and 214 to regulate the temperature of SERDES 220 and 222, respectively. As noted elsewhere herein, such regulation may involve the raising and/or lowering of the temperature of the target components, in this case, the SERDES 220 and 222.

As part of the closed-loop functionality of the temperature control system 204, the temperature sensors 216 and 218 are provided to obtain temperature information from the target components, namely, the SERDES 220 and 222. Generally, this temperature information is fed back to a controller or control circuit (not shown) that is connected with the temperature control system 204, so as to enable temperature based control of the operation of the temperature control system 204. In this way, the temperature sensors 216 and 218 facilitate maintenance of the temperature of the SERDES 220 and 222 at a desired target temperature. As explained earlier, this target temperature corresponds to a desired maximum test data rate. In the illustrated embodiment, the temperature sensors 216 and 218 are, like the SERDES 220 and 222, mounted to the PCB 201. However, the temperature sensors 216 and 218 can, alternatively, be located and configured in any other fashion that enables them to perform the functionality disclosed herein.

With attention now to other aspects of the exemplary test board 200, ports 226 and 228 are provided that, in general, enable the test board 200 to communicate with a master transceiver 230 and a DUT 232, respectively. The ports 226 and 228 may be electrical or optical connections. More particularly, the ports 226 and 228 are connected to master transceiver 230 and DUT 232 through data signal reception and transmission connections, while master transceiver 230 and DUT 232 are connected to each other in an immediate loop back configuration, as discussed below.

More particularly, the master transceiver 230 retransmits data signals, including a test pattern, from SERDES 220 by way of the transmit channel Tx+ and Tx− connections 244. The data signals are then sent to DUT 232 through connections 236. After receipt of the data signal from the master transceiver 230 through connections 236, the DUT 232 then sends the data signal to SERDES 222 through receive channel Rx+ and Rx− connections 238, after which the data signal is processed by the BER circuitry 224. In the alternative, DUT 232 may retransmit a data signal and test pattern from SERDES 222 through the transmit channel Tx+ and Tx− connections 240 and then send the data signal to master transceiver 230 through connections 242. The master transceiver 230 then passes the received data signal to SERDES 220 by way of receive channel Rx+ and Rx− connections 234, after which the data signal is processed by the BER circuitry 224.

With continuing attention to FIG. 2, details are now provided concerning aspects of the operation of the target board 200 with respect to the master transceiver 230 and the DUT 232. In the illustrated embodiment, the test board 200 is employed to determine a bit error rate of the DUT 224 through transmission and reception of data signals and test patterns, where the maximum data rate of such signals and sequences is desirably controlled through regulation of the temperature of certain test board 200 components. To this end, the temperature control system 204 generally operates to control the temperature of test board 200 components, such as SERDES 220 and SERDES 222 for example, so that one or more desired temperatures, or ranges of temperatures, are achieved and maintained. As noted earlier, such temperatures or ranges of temperatures generally correspond with desired maximum data rates or ranges of desired maximum data rates.

More particularly, the BERT 202, or a user, defines and generates a test pattern, and the test pattern is then sent as part of a data signal to the master transceiver 230 through transmit channel Tx+ and Tx− connections 244. The master transceiver 230 then transmits the data signal, with the included test pattern, through connections 236 to the DUT 232. After receiving the data signal from master transceiver 230, the DUT 232 then retransmits the data signal to the SERDES 222, and then the BER circuitry 224, of BERT 202 by way of receive channel Rx+ and Rx− connections 238.

The bit error detectors included in BER circuitry 224 of BERT 202 track bits of received data that do not match the corresponding bits in the test pattern initially generated by the programmable pattern generator of BER circuitry 224, or by a user. The test pattern of the data received by BERT 202 from the DUT 232 is then compared to the initially generated test pattern by the BER circuitry 224, and the bit error rate attributable to the DUT 232 is then calculated.

In connection with the operation of the BERT 202, the temperature control system 204 generally operates to regulate the temperature of one or more test board 200 components, such as the SERDES 220 and 222 of the BERT 202 for example, so that one or more desired maximum test data rates are achieved and maintained.

With more particular reference now to the operation of the exemplary temperature control system 204, the TECs 212 and 214 cooperate with the blowers 208 and 210 to regulate the temperature of SERDES 220 and 222 of BERT 202 so that one or more target temperatures are achieved that correspond with respective desired maximum data rates. By controlling the temperature of SERDES 222 and 222 in this way, embodiments of the present invention enable data transmission rates of, for example, about 4.25 Gb/s to about 4.75 Gb/s or higher in a relatively low cost test board 200. With respect to the foregoing, it should be noted that in some instances at least, the best performance of a device may occur at temperatures outside existing or future industry standards. Accordingly, in one embodiment of the invention, the desired temperature for a target component, such as a SERDES for example, is about 10 to 15 degrees cooler than room temperature.

Various desired thermal and data rate effects can be achieved through manipulation of the operation of the temperature control system 204. By way of example, while similar devices are used to regulate the respective temperatures of SERDES 220 and SERDES 222, the temperature control devices and temperature sensors are separate for each of SERDES 220 and SERDES 222 and can be controlled together or independently, depending upon the effect(s) desired to be achieved. For example, the desired target temperature and, thus, the corresponding data rates, for each of SERDES 220 and SERDES 222 may be different. To this end, at least some exemplary embodiments of the temperature control system are configured to enable independent temperature regulation for each of the SERDES 220 and 222 and, more generally, for one or more ICs. In one exemplary operation, the SERDES 220 is cooled to a temperature corresponding to a data rate of about 4.25 Gb/s, while SERDES 222 is cooled to a temperature corresponding to a data rate of about 4.75 Gb/s.

It should further be noted that at least some embodiments of the invention are well suited to facilitate calibration of various devices. For example, after the BERT 202 has achieved a desired maximum data rate through operation of the temperature control system 204, the data rate can be correlated with the current temperature of the BERT 202 and this information stored in an accessible location, such as in a memory device (not shown) of the BERT 202 or test board 200. In future evolutions involving the operation of that particular BERT, the stored data rate/temperature data can be accessed and the BERT can be readily brought to the temperature corresponding to the desired data rate. In this way, the need to empirically determine the response of the BERT each time a test evolution is performed is obviated.

II. Exemplary Powers Control, and Related Circuits

With attention now to FIGS. 3A through 3E, details are provided concerning exemplary power, control and other test board circuits suitable for use in connection with the control and operation of the BERT 202 and temperature control system 204. At least some of the circuits comprise elements of the BERT 202, while other circuits can be implemented as part of the temperature control system 204. However, the functionalities implemented by the various disclosed circuits can be apportioned among a BERT, such as BERT 202, a temperature control system, such as temperature control system 204, and/or other components in various other arrangements as well.

Further, the scope of the invention is not limited to the exemplary disclosed circuits. Rather, any other circuits, systems and/or devices of comparable functionality may alternatively be employed. Consistent with the foregoing, various exemplary BERTs and associated devices and processes are disclosed and claimed in U.S. patent application Ser. No. 10/285,082, entitled SYSTEM AND METHOD OF PROCESSING A DATA SIGNAL, filed Oct. 31, 2002, and incorporated herein in its entirety by this reference.

Figure 3A:
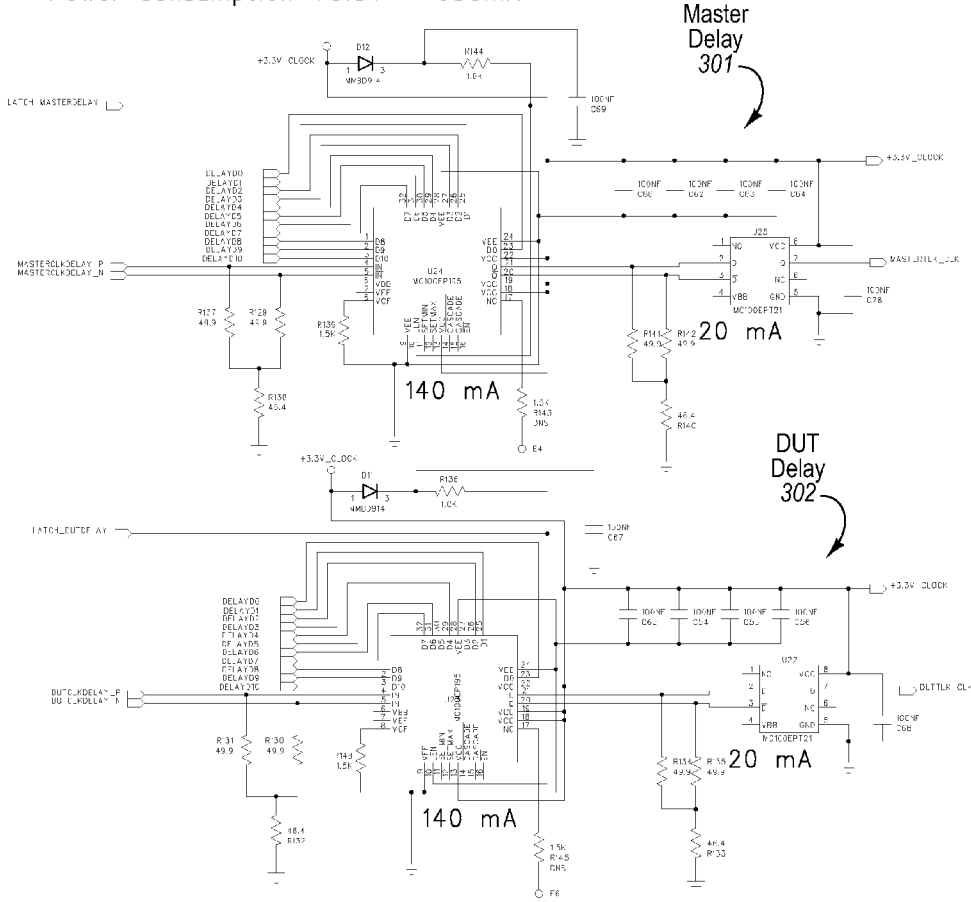
FIG. 3A is a wiring diagram illustrating aspects of an exemplary SERDES data delay control circuit for a reclocker, including a master delay and DUT delay.

Directing attention first to FIG. 3A, exemplary SERDES data delay control circuits for a reclocker, which may also be referred to as a data cleaner, are shown. One example of a data reclocker is disclosed in FIG. 3C, discussed below. In general, the exemplary SERDES data delay control circuits comprise a master delay circuit 301 and a DUT delay circuit 302. The master delay circuit 301 and a DUT delay circuit 302 afford control of the test data stream so that the reclocker is able to reduce or eliminate jitter from the serial input stream. As suggested by their respective names, one particular function of the master delay circuit 301 and the DUT delay circuit 302 is to delay transmission of the test data stream so that the reclocker can operate effectively. Of course, alternative circuits of comparable functionality may be substituted for the master delay circuit 301 and/or the DUT delay circuit 302.

Figure 3B:
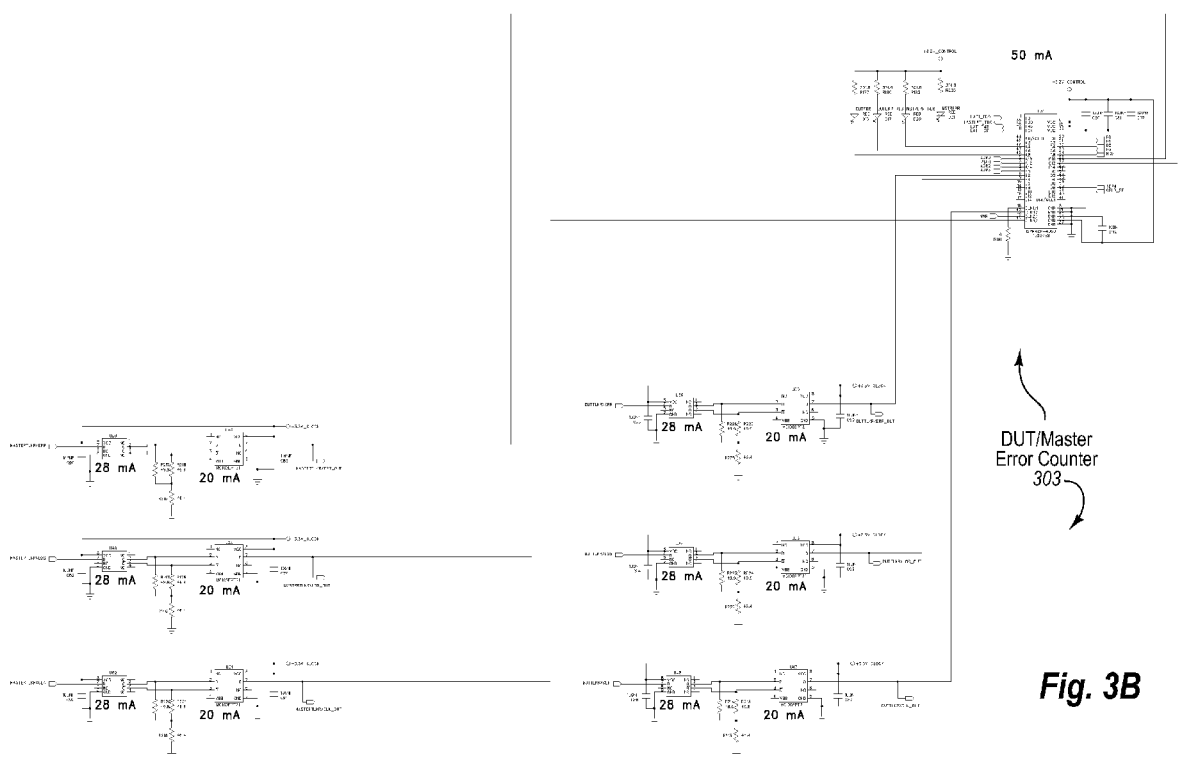
FIG. 3B is a wiring diagram illustrating aspects of an exemplary DUT/master error counter.

With attention now to FIG. 3B, an exemplary DUT/master error counter circuit 303 is shown. In at least some implementations, the DUT/master error counter circuit 303 comprises an element of a BERT, such as the exemplary BERT 202 disclosed in FIG. 2. As indicated in FIG. 3B, the exemplary DUT/master error counter circuit 303 is configured to collect information concerning the number of errors generated by the DUT during reception or transmission of the data. In the illustrated example, the DUT/master error counter circuit 303 serves to count the number of bit errors generated by the DUT.

Figure 3C:
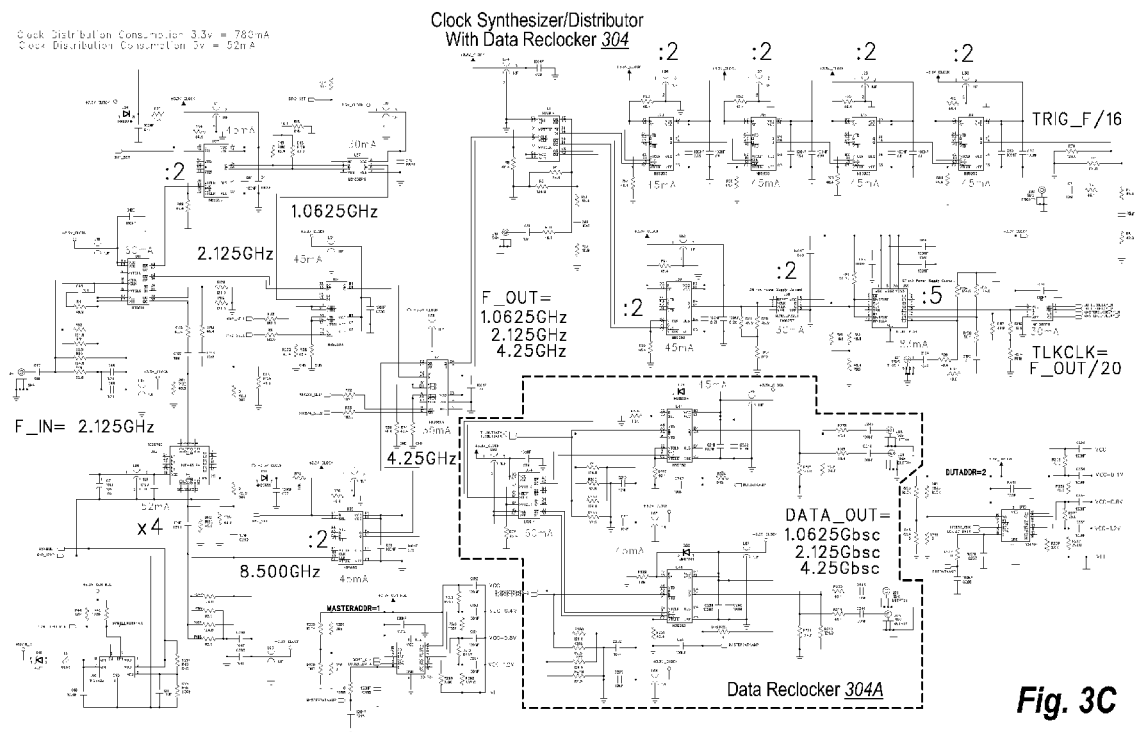
FIG. 3C is a wiring diagram illustrating aspects of exemplary clock distributor circuits, particularly, an exemplary clock synthesizer/distributor and data reclocker.

Turning now to FIG. 3C, an exemplary clock synthesizer/distributor 304, with data reclocker 304A, for a nominal 1×2×4 GHz device is disclosed. The clock synthesizer/distributor 304 may also be referred to herein simply as a clock. The exemplary disclosed circuits are compatible with various data rates so that exemplary clock output frequencies include, but are not limited to, 1.0625 GHz, 2.125 GHz, and 4.25 GHz, although alternative embodiments of such circuits are suited for use with other protocols, clock frequencies and associated data rates, where such data rates may be lower or higher than the aforementioned data rates. More generally then, embodiments of the clock synthesizer/distributor with data reclocker, as well as the other exemplary circuits disclosed in FIGS. 3A through 3I, are suitable for use in connection with nominal A×B×C GHz devices, where "A," "B" and "C" represent different respective data rates achievable within a particular device.

As indicated in FIG. 3C, the exemplary clock synthesizer/distributor 304 with data reclocker 304A is configured to generate a clock signal and to distribute the generated clock signal to various systems and components including, but not limited to, the master device and the DUT. As noted elsewhere herein, the data reclocker 304A serves to reduce or remove high-frequency jitter components from the serial input stream. Thus, the clock synthesizer/distributor 304 and data reclocker 304A cooperate to generate and maintain a consistent and reliable clock for test board operations. It should be noted that the disclosed circuits are exemplary only and alternative circuits of comparable functionality may be substituted for the clock synthesizer/distributor 304 and/or data reclocker 304A.

It was noted earlier herein that embodiments of components such as the temperature control system, BERT and clock, for example, are configured for operation in connection with various power and control circuits of the test board, such as a controller and microcomputer for example. Accordingly, FIG. 3D discloses exemplary embodiments of a complex programmable logic device ("CPLD") 305, microcontroller 306 and power supply circuit 307.

Figure 3D:
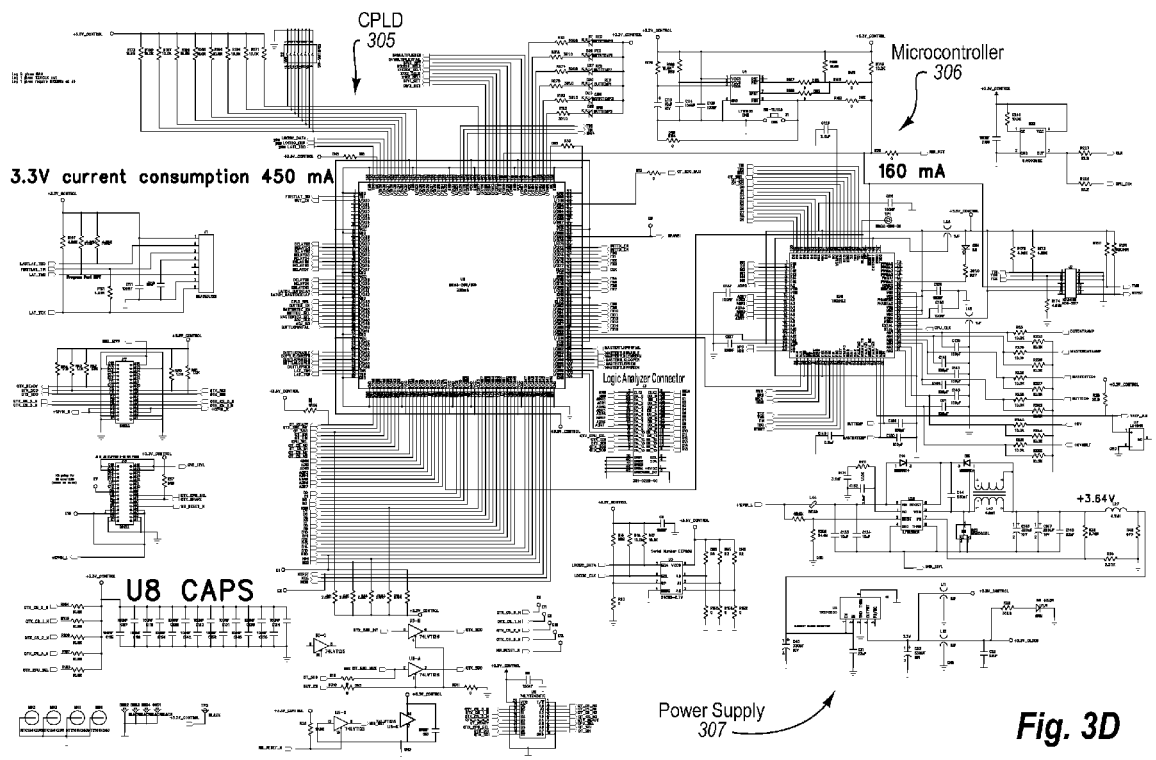
FIG. 3D is a wiring diagram illustrating aspects of exemplary power and control circuits, particularly, a complex programmable logic drive, microcontroller, and power supply.

As indicated in FIG. 3D, the CPLD 305 is configured to cooperate with the microcontroller 306 to monitor and control the operation of the temperature control system, BERT, and clock, based upon internally programmed logic and upon input received from various sources such as, but not limited to, the temperature sensors (not shown) of the temperature control system. For example, the exemplary CPLD 305 is configured to receive inputs such as temperature information concerning the master device and the DUT. Additionally, the CPLD 305 is configured for communication with the microcontroller 306 so that information concerning operations to be performed by the controlled devices can be communicated to the microcontroller 306, where suitable instructions for execution of the operations can be generated, and then transmitted to the appropriate devices. Consistent with the foregoing, the exemplary microcontroller 306 is configured to receive various inputs, including, but not limited to, input concerning the state and operation of the master TEC and the DUT TEC.

With continuing reference to FIG. 3D, the disclosed CPLD 305 and microcontroller 306 are configured to cooperate with each other and use information obtained by temperature sensors (see, e.g., FIGS. 3G and 3H) as a basis for controlling the temperature of one or more target devices, such as a master SERDES and DUT SERDES. In this way, the exemplary CPLD 305 and microcontroller 306 enable thermally based control of data rates associated with the test board and related systems and devices.

In addition to the CPLD 305 and microcontroller 306, FIG. 3D also discloses, as noted above, an exemplary power supply circuit 307. Among other things, the power supply circuit 307 serves to provide the test board, and associated master device and DUT, with power to enable performance of various testing evolutions. As in the case of other circuits disclosed herein, the disclosed power supply circuit is exemplary only and alternative circuits of comparable functionality may be substituted for the power supply circuit 307.

Figure 3E:
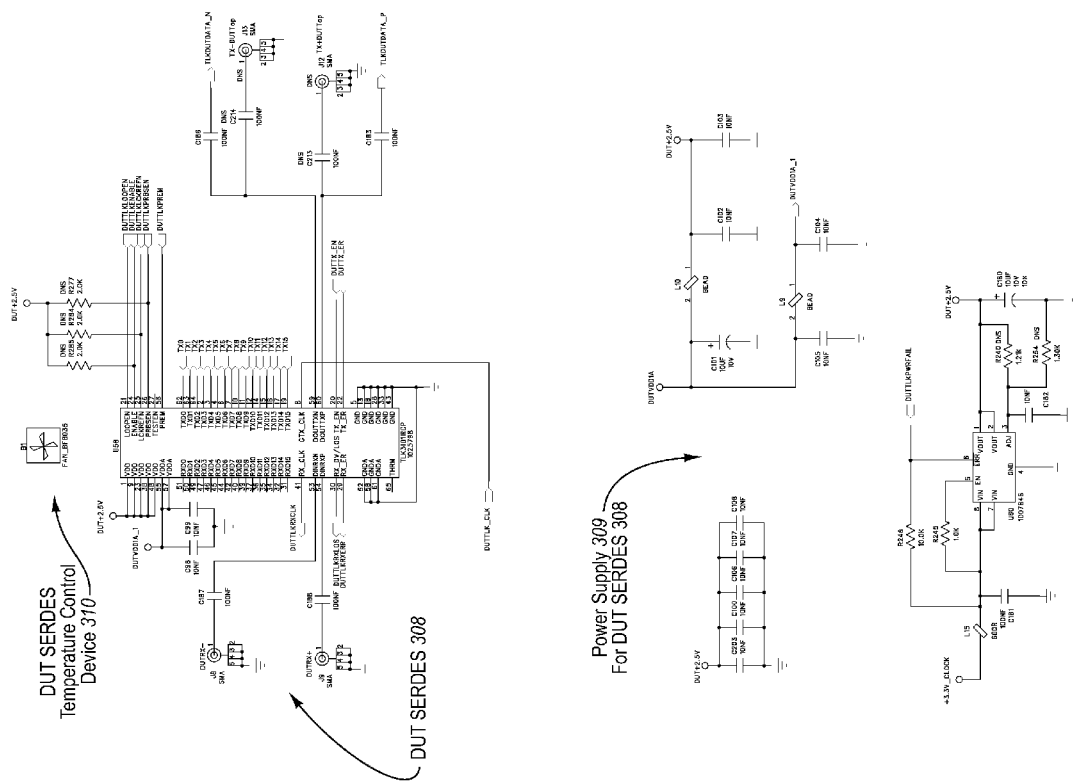
FIG. 3E is a wiring diagram illustrating aspects of exemplary DUT circuits, particularly, a SERDES associated with the DUT and a corresponding power supply and temperature control device.
Figure 3F:
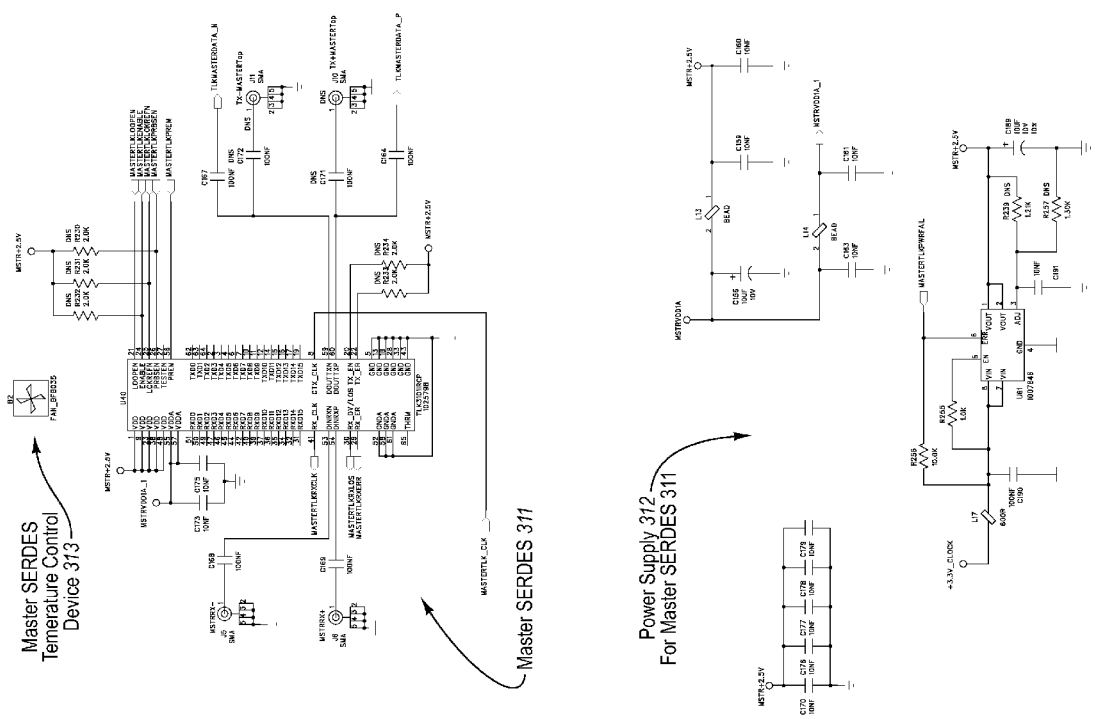
FIG. 3F is a wiring diagram illustrating aspects of exemplary master circuits, particularly, a SERDES associated with the master device and a corresponding power supply and temperature control device.

With attention now to FIGS. 3E and 3F, exemplary SERDES and associated circuits are disclosed. Directing attention first to FIG. 3E, an exemplary DUT SERDES 308 is disclosed. In at least some implementations, the DUT SERDES 308 comprises an element of a BERT, such as the exemplary BERT 202 disclosed in FIG. 2. As disclosed elsewhere herein, the DUT SERDES 308 serves to serialize deserialized data, and is also able to deserialize serialized data. The particular function(s) performed by the DUT SERDES 308 will depend upon considerations such as, but not limited to, the configuration of the testing setup and the type of testing evolution(s) to be performed.

In connection with the operation of the DUT SERDES 308, a power supply 309 for the DUT SERDES 308 is also provided, as disclosed in FIG. 3E. In at least some embodiments, the power supply 309 is included as an element of the test board, but may alternatively be implemented within the BERT itself. The disclosed power supply 309 is exemplary only and alternative circuits of comparable functionality may be substituted for the power supply 309.

Finally, FIG. 3E also discloses a temperature control device 310 for the DUT SERDES 308. In the illustrated embodiment, the temperature control device 310 is implemented as a fan. More generally however, any other temperature control device(s) configured to enable management of the temperature of a target device, such as the DUT SERDES 308, may alternatively be employed. In at least some embodiments of the invention, the operation of the temperature control device 310 is controlled by the CPLD 305 and/or the microcontroller 306 (see FIG. 3D), based upon input provided by a temperature sensor associated with the DUT SERDES 308.

Turning now to FIG. 3F, the circuits disclosed there are generally similar to those disclosed in FIG. 3E. Accordingly, it should be noted that the discussion of FIG. 3E above is generally germane as well to the circuits disclosed in FIG. 3F.

With particular reference to FIG. 3F, an exemplary master SERDES 311 is disclosed, and operates in a fashion similar to that of the DUT SERDES 308. As in the case of the DUT SERDES 308, the particular function(s) performed by the master SERDES 311 will depend upon considerations such as, but not limited to, the configuration of the testing setup and the type of testing evolution(s) to be performed.

Similar to the case of the circuits disclosed in FIG. 3E, a power supply 312 for the master SERDES 311 is also provided, as disclosed in FIG. 3F. The power supply 312 is included as an element of the test board in some instances, but may alternatively be implemented within the BERT itself.

As well, FIG. 3F also discloses a temperature control device 313 for the master SERDES 311. In the illustrated embodiment, the temperature control device 313 is implemented as a fan. More generally however, any other temperature control device(s) configured to enable management of the temperature of a target device, such as the master SERDES 311, may alternatively be employed. In some alternative embodiments, a single temperature control device may be used to aid in the regulation of target devices such as the SERDES while, in yet other implementations, multiple temperature control devices may be dedicated to a single target device.

With respect to the foregoing, it should be noted that use of the notation 'temperature control device' herein generally refers to any device, or devices, that aid in the regulation of the temperature of a target device and, accordingly, such term should not be construed to be limited solely to devices that aid in removing heat from the target device.

Figure 3G:
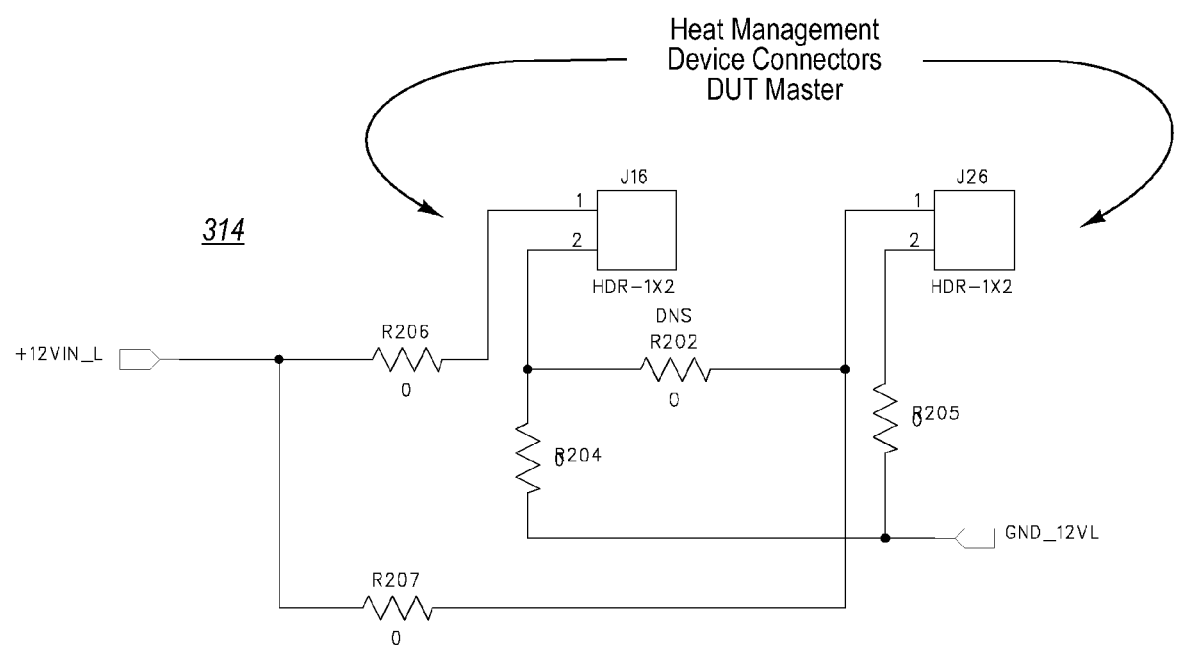
FIG. 3G is a wiring diagram illustrating aspects of an exemplary temperature control device connection circuit for the DUT and the master device.

With continuing attention to FIGS. 3E and 3F, and directing attention now to FIG. 3G, an exemplary temperature control device connector arrangement 314 is disclosed. As indicated in the exemplary arrangement of FIG. 3G, respective temperature control device connectors are provided for the DUT and for the master device. The temperature control device connector arrangement 314 enables the temperature control devices such as the temperature control devices 310 and 313 disclosed in FIGS. 3E and 3F, respectively, to receive power and control signals. Any other connector arrangement(s) of comparable functionality may alternatively be employed however.

Figure 3H:
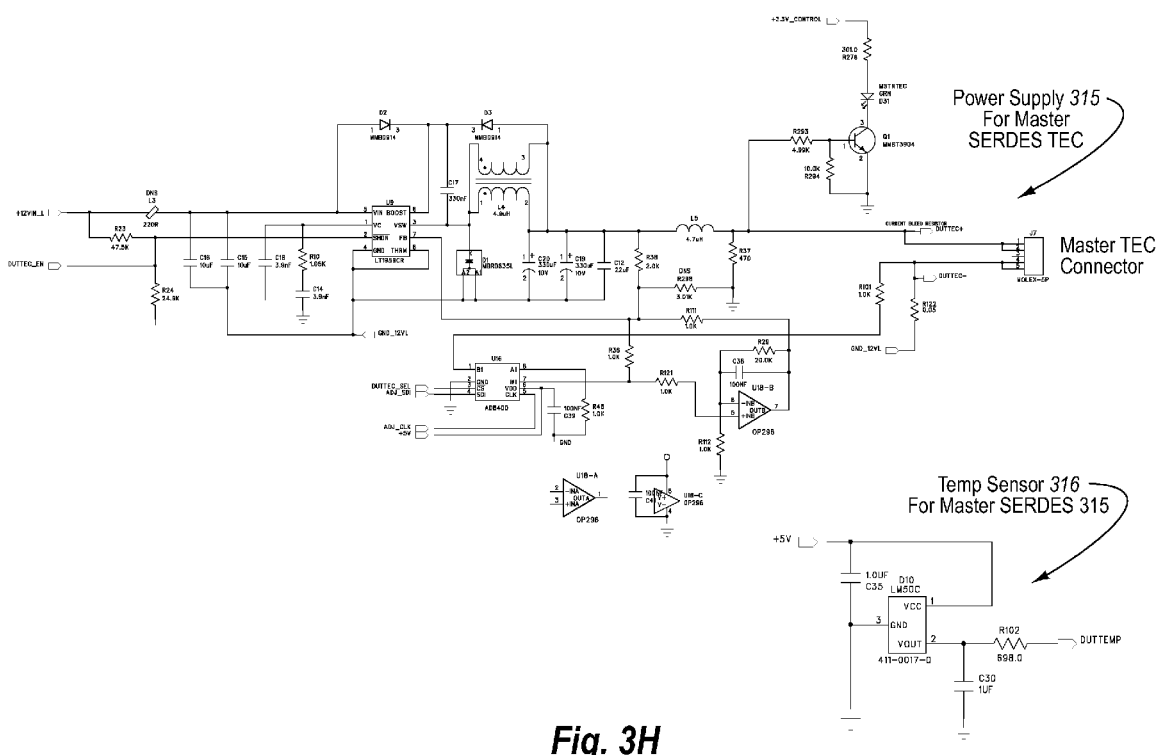
FIG. 3H is a wiring diagram illustrating aspects of an exemplary power supply circuit for the master SERDES, as well as an exemplary temperature sensor circuit for the master SERDES.
Figure 3I:
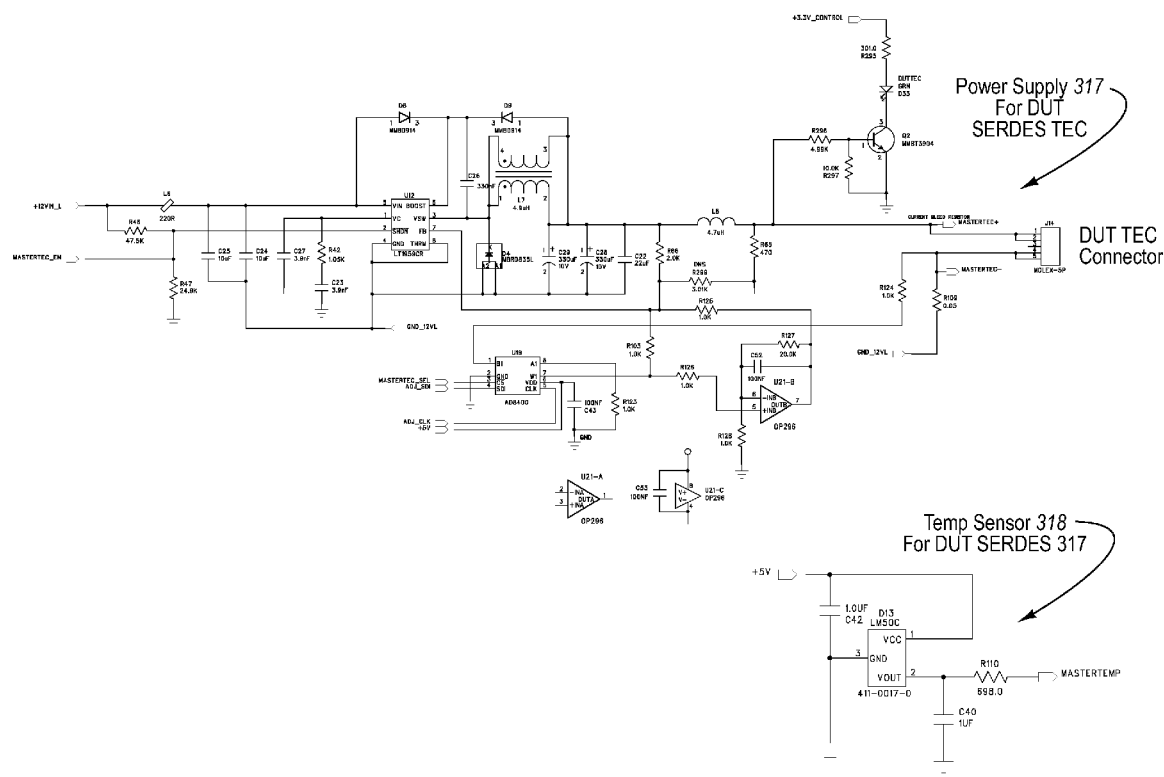
FIG. 3I is a wiring diagram illustrating aspects of an exemplary power supply circuit for the DUT SERDES, as well as an exemplary temperature sensor circuit for the DUT SERDES.

Directing attention now to FIGS. 3H and 3I, exemplary TEC power supply and temperature sensor circuits are disclosed. With reference first to FIG. 3H, a master TEC power supply circuit 315 is provided that is configured to power the TEC that is thermally connected with the master SERDES. As further indicated in FIG. 3H, and with reference also to FIG. 3D, the master TEC power supply circuit 315 is connected with the CPLD 305. As a result of this arrangement, the operation of the master TEC power supply circuit 315 can be controlled by the CPLD 305 and the microcontroller 306.

With continued reference to FIG. 3H, an exemplary temperature sensor circuit 316, or simply temperature sensor, is disclosed. The temperature sensor circuit 316 is, in this exemplary embodiment, dedicated to the master SERDES and serves to monitor, and report on, the temperature of the master SERDES. Because at least some embodiments of the invention are concerned with closed-loop feedback control of SERDES temperature, the temperature information obtained by the temperature sensor circuit 316 is output to the microcontroller 306 and the microcontroller 306 then uses that temperature information to adjust the performance of the temperature control system as/if required.

In one exemplary embodiment, a single temperature sensor circuit is employed for each SERDES, or other IC whose performance is to be managed through the use of thermal effects. In alternative embodiments, a single temperature sensor circuit is employed with multiple ICs while in still other embodiments, multiple temperature sensors can be employed with a single IC. Accordingly, the scope of the invention should not be construed to be limited to the exemplary embodiments illustrated in the Figures.

Turning now to FIG. 3I, a TEC power supply circuit 317 is disclosed that is configured to power the TEC that is thermally connected with the DUT SERDES. As further indicated in FIG. 3I, and with reference also to FIG. 3D, the DUT TEC power supply circuit 317 is connected with the CPLD 305. As a result of this arrangement, the operation of the DUT TEC power supply circuit 317 can be controlled by the CPLD 305 and the microcontroller 306.

Finally, FIG. 3I also discloses a temperature sensor circuit 318. The temperature sensor circuit 318 is, in this exemplary embodiment, dedicated to the DUT SERDES and serves to monitor, and report on, the temperature of the DUT SERDES. With regard to other details concerning the configuration, arrangement and operation of the temperature sensor circuit 318, the discussion of the temperature sensor circuit 316 is germane.

III. Exemplary Calibration and Control Methods

Figure 4:
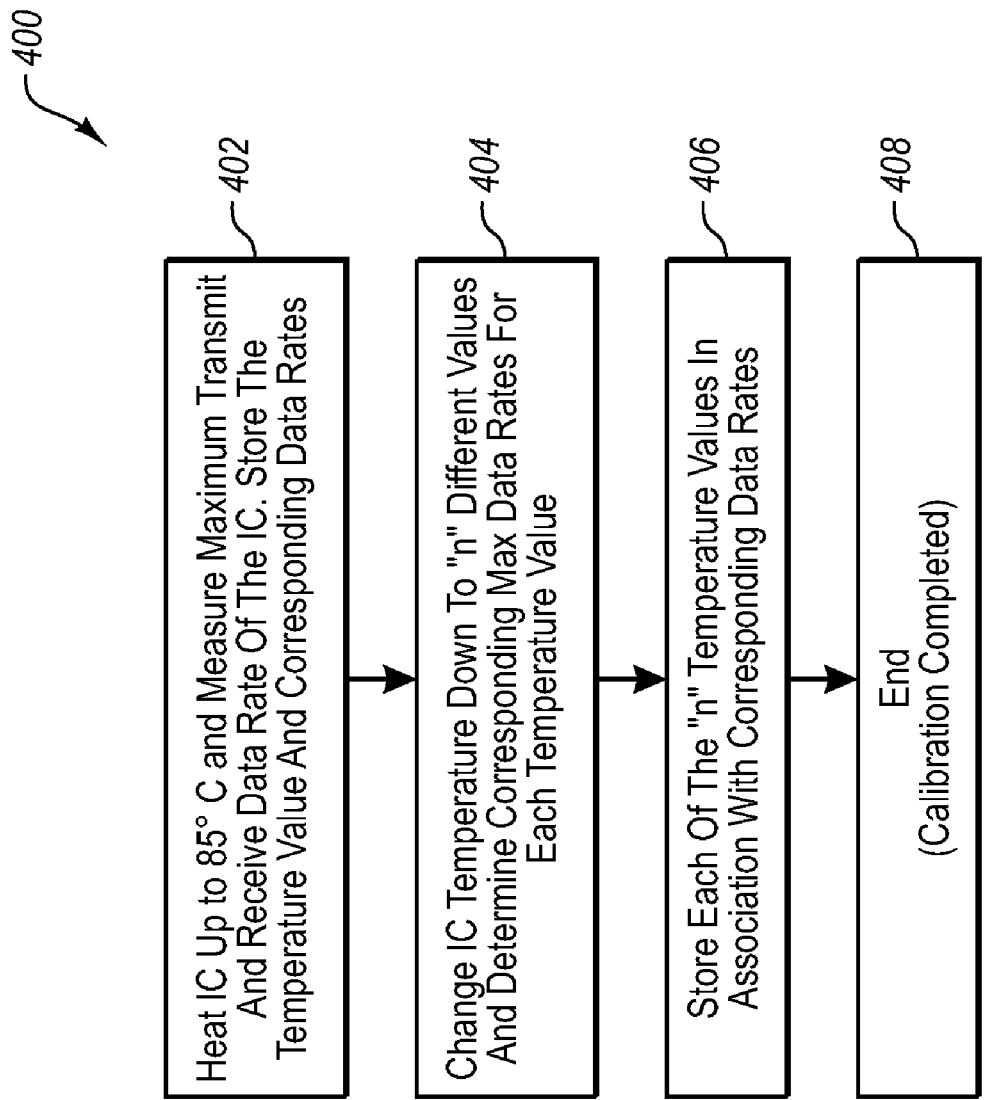
FIG. 4 is a flow diagram illustrating aspects of an exemplary method for thermally based calibration of an IC.

With attention now to FIG. 4, aspects of an exemplary process 400 for thermally based calibration of an integrated circuit (IC) are disclosed. In general, the process 400 is concerned with determining, for a particular IC or group of ICs, respective maximum data rates associated with various operating temperatures. In this way, subsequent operation of the IC at a desired maximum data rate can be readily achieved by regulating the temperature of the IC to remain at, or near, the temperature that was previously determined to correspond to the desired maximum data rate. This calibration information can be stored, for example, in a lookup table of a memory device of the test board, or the calibration data can otherwise be made accessible by the CPLD and/or microcontroller of the test board. The process 400 may be performed in connection with any IC whose performance in terms of maximum data rate can be adjusted through the use of thermal effects. As disclosed elsewhere herein, one example of such an IC is a SERDES, but the scope of the invention is not so limited.

Prior to execution of the example process 400, master and DUT transceivers may be replaced with electrical HF cables, for example. At stage 402, the SERDES temperature is brought to about +85° C., although one or more other temperatures may be employed with different devices and/or in connection with other operating conditions. The maximum data transmission and reception rates associated with the +85° C. temperature are then measured by, for example, an external generator and error detector connected to the SERDES by the electrical HF cables. The initial SERDES temperature is stored, in a lookup table for example, in association with the maximum data rate that corresponds to that initial SERDES temperature. The lookup table can reside in one or more of the test board components, or may be located in an external device. Generally speaking, one SERDES, when brought to the lowest temperature, could be used as the external error detector and pattern generator.

Next, at stage 404, the temperature of the SERDES is changed to multiple, or "n," different values, and the corresponding maximum data rates determined for each of the "n" SERDES temperatures. Proceeding now to stage 406, each of the "n" temperature values is stored in the lookup table in association with the corresponding maximum data rates. With regard to stage 406, the temperature values and respective data rates can be stored all at one time as a batch, or serially as each temperature is measured and the respective maximum data rates associated with those temperatures are determined. Finally, the process 400 terminates at stage 408 where calibration of the SERDES is completed.

As disclosed above, some embodiments of the invention are concerned with a process for calibrating an IC using thermally based manipulation of a data rate associated with the IC. Once the IC is calibrated in this fashion, the calibration information can then be used as a basis for controlling the operation of the device.

It should be noted however that it may be desirable in some instances to operate the IC without having first calibrated the IC. In particular, if calibration is not performed, the temperature that corresponds with a desired maximum data rate can be determined 'on the fly,' simply by modifying the temperature of the IC until the desired data rate is obtained. Once the desired rate is achieved, the corresponding IC temperature is then maintained.

Figure 5:
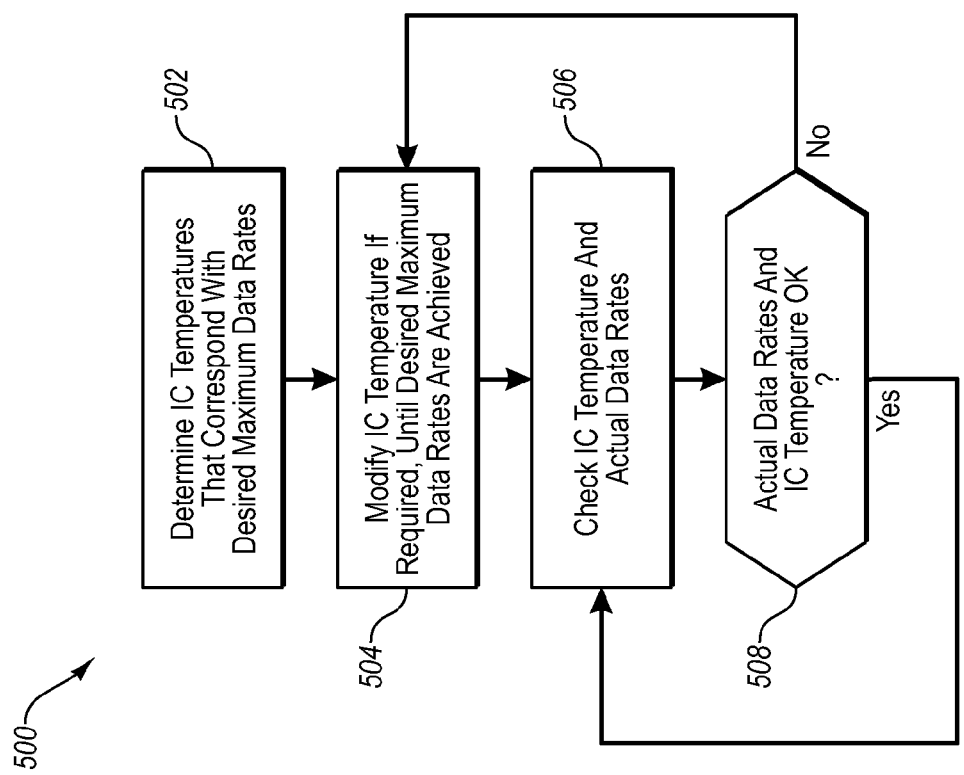
FIG. 5 is a flow diagram illustrating aspects of an exemplary method for thermally based control of the operation of an IC.

Directing attention now to FIG. 5, details are provided concerning an exemplary process 500 for thermally based operation of an IC, such as a SERDES for example, so as to achieve and maintain a desired maximum data rate with respect to the IC. At stage 502, the temperature of the SERDES that corresponds with a desired maximum data rate is determined. In at least one embodiment, the SERDES temperature is adjusted and maintained as necessary to achieve about 110% of the required maximum data rate. This evolution can be performed empirically by simply changing the temperature of the IC until the desired maximum data rate is achieved. Alternatively, this evolution can be performed by accessing calibration data and adjusting the temperature of the SERDES, based on input from the temperature sensor, to the temperature value known to correspond with the desired data rate.

At stage 504, the temperature of the SERDES is then adjusted, if necessary, until the desired data rate is achieved. Depending upon the desired maximum data rate, such temperature adjustments can involve heating and/or cooling of the SERDES. Once the desired maximum data rate is achieved, the performance of the SERDES is monitored at stage 506 by checking the data rate and monitoring the SERDES temperature with a temperature sensor.

When the data rate or SERDES temperature has been determined at stage 506, the process 500 advances to decision point 508. At the decision point 508, a determination is made as to whether the data rate or SERDES temperature is at an acceptable value, or within an acceptable range of values. If so, the process 500 returns to stage 506 and, if not, the process 500 returns to stage 504. In this way, the temperature and, accordingly, the maximum data rate of the SERDES, is maintained at a desired value, or within a desired range of values, by regulation of the temperature of the SERDES. Once the desired maximum data rate is achieved, various testing evolutions can then be performed with respect to a DUT, as disclosed elsewhere herein.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A test board for testing devices, comprising:
   first and second communication ports configured for communication with a master device and a DUT, respectively;
   a bit error rate tester arranged for communication with the master device and with the DUT by way of the first and second communication ports, respectively, and the bit error rate tester including at least one IC whose maximum data rate is temperature sensitive; and
   a temperature control system arranged for thermal control of the IC of the bit error rate tester.

2. The test board as recited in claim 1, wherein the at least one IC comprises a SERDES.

3. The test board as recited in claim 1, wherein the test board is Fibre Channel compatible and is capable of operation at nominal data rates of 1.0625 Gb/s, 2.125 Gb/s, and 4.25 Gb/s.

4. The test board as recited in claim 1, wherein test board is configured for use with a DUT and master device that are connected with each other in an immediate loop-back arrangement.

5. The test board as recited in claim 1, further comprising a microcontroller and CPLD connected with each other, and wherein the temperature control system comprises:
   a temperature control device connected with at least one of the microcontroller and the CPLD, and the temperature control device arranged for thermal communication with the IC; and
   a temperature sensor connected with at least one of the microcontroller and the CPLD, and the temperature sensor arranged for thermal control of the IC.

6. The test board as recited in claim 5, wherein the temperature control device comprises at least one of: a TEC; and, a fan.

7. The test board as recited in claim 5, wherein the temperature control device is mounted on the IC.

8. The test board as recited in claim 1, wherein the first and second communication ports are configured for communication with a master transceiver and a test transceiver, respectively.

9. A test board for testing devices, comprising:
   first and second communication ports configured for communication with a master device and a DUT, respectively;
   a bit error rate tester arranged for communication with the master device and with the DUT by way of the first and second communication ports, respectively, and the bit error rate tester including at least one IC whose maximum data rate is temperature sensitive; and
   means for regulating temperature, the means for regulating temperature serving to substantially maintain the IC at a temperature that corresponds with a desired maximum data rate.

10. The test board as recited in claim 9, wherein the means for regulating temperature brings the IC to the temperature that corresponds with the desired maximum data rate.

11. The test board as recited in claim 9, wherein the means for regulating temperature cools or heats the IC as necessary to maintain the temperature that corresponds with the desired maximum data rate.

12. The test board as recited in claim 9, wherein the means for regulating temperature adjusts the temperature of the IC based upon temperature information concerning the IC.

13. The test board as recited in claim 9, wherein the means for regulating temperature adjusts the temperature of the IC as necessary to facilitate achievement of another desired maximum data rate.

14. The test board as recited in claim 9, wherein the means for regulating temperature employs a thermoelectric cooling effect to maintain the temperature of the IC.

15. The test board as recited in claim 9, wherein the means for regulating temperature employs a closed-loop feedback method to maintain the temperature of the IC.

* * * * *

UNITED STATES PATENT AND TRADEMARK OFFICE
CERTIFICATE OF CORRECTION

PATENT NO. : 7,649,374 B2  Page 1 of 1
APPLICATION NO. : 11/469716
DATED : January 19, 2010
INVENTOR(S) : Fishman et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 795 days.

Signed and Sealed this

Twenty-eighth Day of December, 2010

David J. Kappos
*Director of the United States Patent and Trademark Office*